United States Patent [19]
Carmen

[11] Patent Number: 4,853,631
[45] Date of Patent: Aug. 1, 1989

[54] MAGNETORESISTIVE SENSOR HAVING INTER-LEAVED MAGNETORESISTIVE ELEMENTS FOR DETECTING ENCODED MAGNETIC INFORMATION

[75] Inventor: Ralph Carmen, Lebanon, N.J.

[73] Assignee: The Superior Electric Company, Bristol, Conn.

[21] Appl. No.: 117,035

[22] Filed: Nov. 4, 1987

[51] Int. Cl.$^4$ .................. G01B 7/14; H03K 17/90; H03K 19/18; H01L 43/06
[52] U.S. Cl. .................................. 324/208; 324/252; 307/309; 338/32 R
[58] Field of Search .................. 324/207, 208, 252; 338/32 R; 307/309; 360/113

[56] References Cited
U.S. PATENT DOCUMENTS

| | | | |
|---|---|---|---|
| 4,418,372 | 11/1983 | Hayashida et al. | 324/252 |
| 4,639,807 | 1/1987 | Sekizawa et al. | 324/252 |

Primary Examiner—Reinhard J. Eisenzopf
Assistant Examiner—Walter E. Snow
Attorney, Agent, or Firm—McCormick, Paulding & Huber

[57] ABSTRACT

A magnetoresistive sensor includes groups of MR elements arranged on a non-magnetic substrate for selective connection to detect and sense magnetic information recorded on a number of different diameter encoder wheels of which each diameter wheel may have a different number of pieces of magnetic information recorded at corresponding different wavelengths ($\lambda$) on a circumferentially running track located on the circumferential face of the wheel. The MR sensor includes an additional MR element arrangement for detecting and sensing index magnetic information recorded on an additional circumferentially running track located on the circumferential face of the wheel. The connection arrangement of the MR elements is such to form external power supply connection terminals which have a width substantially larger than the width of the MR elements and surround the MR elements covering a substantial portion of the substrate surface to form a heat sink to eliminate thermal gradients from developing across the substrate thereby providing thermal stability.

6 Claims, 3 Drawing Sheets

MAGNETORESISTIVE SENSOR HAVING INTER-LEAVED MAGNETORESISTIVE ELEMENTS FOR DETECTING ENCODED MAGNETIC INFORMATION

BACKGROUND OF THE INVENTION

The present invention relates generally to a position encoder for encoding the position of a moving member, and relates more particularly to a magnetic sensor having magnetoresistive (MR) elements arranged to sense plural pieces of magnetic information recorded on an encoder wheel wherein each diameter wheel may contain a different number of pieces of magnetic information recorded thereon at an associated different spacing.

It is well known in the art that when a MR element made of a MR material such a permalloy is placed in a magnetic field and current is supplied to the element, the resistance value of the MR element varies depending upon the intensity of the magnetic field. Thus, when such a MR element is used in place of a magnetic head to sense magnetic information recorded on a magnetic recording medium, the recorded magnetic information can be reliably sensed even when the relative velocity between the magnetic recording medium and the MR element is zero, that is, even in a stopped condition of the magnetic recording medium.

It is also known in the art to use the principle of MR resistance value change due to the presence of a magnetic field to sense the velocity of rotation or angular position of rotation of a rotating body carrying magnetic information and moving in proximity to the MR element. A transducer apparatus using the principle of the detection of the resistance value of a MR element in the presence of a magnetic field to detect the relative displacement of a magnetic information carrying medium is disclosed, for example, in U.S. Pat. No. 4,039,936 issued Aug. 2, 1977 to A. L. Jones, et al., U.S. Pat. No. 4,403,187 issued Sept. 6, 1983 to Takahashi, et al., U.S. Pat. No. 4,628,259 issued Dec. 9, 1986 to Takahashi, et al., and U.S. Pat. No. 4,639,807 issued Jan. 27, 1987 to Sekizawa, et al.

It is also known in the art to record serial pieces of magnetic information on a circumferential track provided on the surface of a drum-like rotary magnetic recording medium with the MR elements of the sensor disposed to extend transverse to the circumferential direction of movement of the magnetic recording medium with the sensor being brought into close proximity and opposite to the magnetic information recorded on the magnetic recording medium. The serial pieces of magnetic information are generally recorded as north(N) and south(S) poles on the circumferential face surface of the recording medium with the spacing between the poles, also referred to as wavelength ($\lambda$), being relatively small to achieve a high recording density and accordingly, to read the recorded information with a higher resolution during movement of the recording medium. Since only a finite number of poles may be recorded on a recording medium, such as an encoder wheel, a predetermined and generally limited number of pulses can be produced. It has been found that the resolution is improved by using a sensor having a plurality of MR elements arranged in a relatively phase shifted relation. That is, the MR elements are spaced apart from one another by a predetermined distance and in accordance with the spacing of the magnetic information recorded on the magnetic recording medium. As the spacing between each piece of recorded information on the magnetic recording medium is made smaller to increase the number of pieces of information and accordingly the number of output pulses to improve the resolution or sensor sensitivity, the spacing between successive MR elements must also be made smaller to accommodate the smaller spacing between each piece of recorded information. Therefore, a number of different sensors each having a different MR element spacing to accommodate a specific corresponding spacing of recorded information on a magnetic recording medium, such as, an encoder wheel, are required. Consequently it is necessary to keep a large inventory of different diameter encoder wheels of which each diameter may have a different number of pieces of recorded magnetic information and a corresponding different sensor for each of the different encoder wheels. Accordingly, it would be desirable to be able to use a single sensor to sense a number of different diameter encoder wheels each having a different number of pieces of magnetic information recorded at a number of predetermined distances from one another whereby the incremental movement of the encoder wheel can be detected with a high degree of accuracy.

In addition to sensing the incremental movement of an encoder wheel it is often desirable to be able to determine the absolute displacement of a moving member, for example, the number of rotations of a shaft of an electric motor or other apparatus to which the encoder wheel is coupled. Accordingly, it is also desirable to use the same magnetoresistive sensor to sense magnetic information recorded on the magnetic recording medium, such as, for example, on an index track of an encoder wheel wherein the magnetic information is recorded along an index track on the circumferential face surface of the wheel. A system for sensing magnetically recorded incremental and index information is disclosed in a copending application filed concurrently herewith and assigned to the same assignee as the present invention, and entitled MAGNETIC ROTARY ENCODER SYSTEM Ser. No. 117,036.

Another problem often encountered with MR sensors is due to thermal gradients that develop across the surface of a substrate upon which the magnetoresistive material is deposited to form the MR sensing elements. Heat generated when voltage is applied to the MR elements often causes the MR elements to shift from their aligned relationship thereby producing inaccurate sensing of magnetic information, no sensing or severely reduces signal amplitudes. Some MR sensors attempt to solve the thermal gradient problem by adding heating means to the substrate to maintain a constant temperature across the substrate surface. The solution is not acceptable because there is an increase in power consumption and heat dissipation and the sensor must be made larger to accommodate the heating means.

It is an object of the present invention therefore, to provide a single MR sensor having a MR element array that may be used with a number of different diameter encoder wheels of which each diameter wheel may have a different number of pieces of magnetic information recorded at corresponding different spacings from one another and along an incremental track on the circumferential face of the wheel.

It is a further object of the present invention to provide on the single MR sensor an additional array having MR elements arranged to sense magnetic information recorded on an index track on the circumferential face of an encoder wheel.

It is yet a further object of the present invention to provide a MR sensor that is substantially free of thermal gradients which affect the sensitivity and accuracy of the sensor.

SUMMARY OF THE INVENTION

In accordance with the present invention, a magnetoresistive (MR) displacement sensor for use with a number of different diameter encoder wheels of which each diameter wheel may have a different number of pieces of magnetic information recorded at corresponding different wavelengths ($\lambda$) on at least one circumferentially running track located on the circumferential face of the wheel is disclosed. In accordance with one aspect of the invention, the sensor is arranged to sense incremental information with at least two groups of MR elements in which each group includes a number of elongated stripe-shaped MR elements in a side-by-side relation with one another on a non-magnetic substrate. Each of the MR elements extends in a longitudinal direction transverse to the direction of relative movement between the sensor and the encoder wheel. The width of each of the MR elements in the rotation direction is substantially smaller than the wavelength ($\lambda$). In further accordance with the invention, each of the groups includes at least three MR elements wherein the respective first ends of the three MR elements associated with each respective group are connected together. The spacing between the first and second MR elements in the first group is at a first predetermined distance in the direction of movement and the spacing between the second and third MR elements in the first group is spaced a second predetermined distance in the direction of movement. The spacing between the first and second MR elements in the second group are spaced a third predetermined distance in the direction of movement and the spacing between the second and third MR elements in the second group are spaced a fourth predetermined distance in the direction of movement. Additionally, the third MR element of the first group and the first MR element of the second group are spaced a fifth predetermined distance from one another. Preferably, the second, third and fifth distances are substantially equal to one another and the first and fourth distances are substantially equal to one another. The connected first ends of the three MR elements associated with the first group form a first external power supply connection terminal and the connected first ends of the three MR elements associated with the second group form a second external power supply connection. In further accordance with the invention, means forming an output connection terminal at each respective second end of the MR elements in each of the groups extend in the longitudinal direction and are arranged in a side-by-side relation along one side of the substrate.

In an additional aspect of the present invention, a third group of MR elements not associated with the first and second group are provided for sensing index magnetic information recorded on another circumferential running track of the encoder wheel. The MR elements in the index group are elongated, stripe-shaped elements arranged in a side-by-side relation with one another on the non-magnetic substrate and are disposed substantially symmetrical with and longitudinally opposite the MR elements of the first and second groups. The width of the MR elements of the index group are substantially smaller than the wavelength ($\lambda$) of the magnetically recorded index information and the respective first ends of the index MR elements are connected together. Means forming an index connection terminal extend from the respective first ends to a position adjacent the output connection terminals of the incremental MR elements. The second end of one of the MR elements in the index group is connected to the commonly connected first ends of one of the first and second groups of incremental MR elements and the second end of the other of the MR elements in the index group is connected to the commonly connected first ends of the other of the first and second groups of incremental MR elements. The MR elements of the index group are spaced a distance substantially equal to the spacing between the first and second groups of MR elements.

In further accordance with the invention, the commonly connected ends of the MR elements forming the first and second power supply connection terminals are arranged on the substrate to substantially surround the MR elements to form a heat sink to carry heat from the substrate to the power supply connection terminals thereby maintaining a substantially constant temperature across the substrate.

BRIEF DESCRIPTION OF THE DRAWINGS

Additional objects, features and advantages of the present invention will become readily apparent from the following description and claims taken in conjunction with the accompanying drawings wherein:

DETAILED DESCRIPTION OF THE PREFERRED EMBODIMENTS

Figure 1:
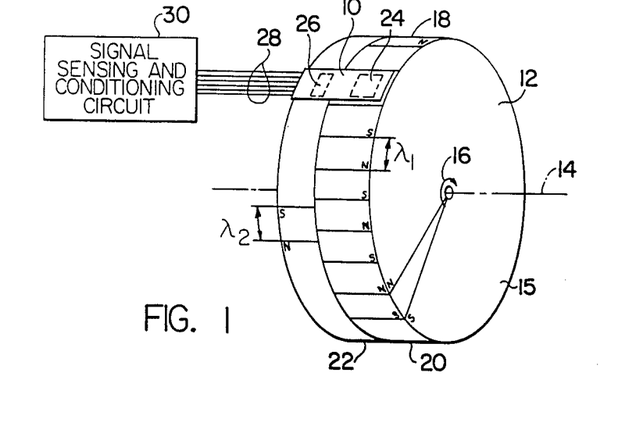
FIG. 1 is a schematic view showing an arrangement in which a MR sensor embodying the present invention is associated with a rotary encoder wheel having magnetic information recorded thereon and to be sensed by the MR sensor.

Turning now to the drawings and considering FIG. 1 in particular, a magnetoresistive sensor embodying the present invention is shown in close proximity to a rotary encoder wheel having magnetic information recorded thereon and which information is to be sensed by the sensor 10. The encoder wheel 12 rotates about an axis 14 in a direction indicated generally by the arrow 16. Magnetic information is recorded on the circumferential face surface 18 of the wheel 12 on one or more circumferentially running tracks, in FIG. 1 indicated at 20, 22. By way of example, in FIG. 1, track 20 includes magnetic information recorded in the form of north(N) and south(S) magnetic poles at a spacing or wavelength designated ($\lambda$)1. The magnetic information is sensed and generally used to detect incremental movement of the encoder wheel 12. The wavelength of the recorded magnetic information is chosen to produce a desired number of pulses or pole count per revolution for an encoder wheel having a given diameter to provide a desired resolution in accordance with a specific application. The magnetic information recorded on the encoder wheel 12 is sensed by the MR element pattern array enclosed within the dotted lines shown generally at 24 and which MR element pattern appears on the surface of the sensor 10 closest to the circumferential face surface 18 of the encoder wheel 12.

In some applications it is desirable to determine the absolute position, that is, the number of revolutions of the encoder wheel 12 from a starting position and accordingly, a shaft or other rotating member to which the encoder wheel 12 is attached. The number of revolutions of the encoder wheel may be determined by sensing magnetic information recorded on the circumferential face surface 18 along an index track 22 wherein the magnetic information is recorded at a spacing or wavelength ($\lambda$) 2. The index magnetic information is sensed by an MR element pattern array indicated generally within the dotted lines 26. Again, the index MR element pattern array appears on the surface of the sensor 10 closest to the face surface 18 of the encoder wheel 12.

The sensor 10 is electrically coupled by an electrical conduit generally shown at 28 to a signal sensing and conditioning circuit shown generally within the function block at 30. The electrical conduit 28 may be of any well known type, such as, for example, a flat ribbon, flexible, multiple conductor conduit. The use of a flat ribbon conduit facilitates electrical connection to, typically by an elastomeric connection, or zebra strip output terminations of the sensor 10 which is relatively minaturized and thereby allowing positioning of the sensor in close proximity to the circumferential face surface 18 of the encoder wheel 12.

Although it is possible to record magnetic information on the radial surface 15 of the encoder wheel 12 and to locate the magnetoresistive sensor 10 in close proximity thereto, the arrangement is not preferable since the spacing between the radial surface of the wheel and the sensor is not stable due to lateral movement of the wheel toward and away from the sensor as the shaft attached to the encoder wheel moves laterally. Lateral movement of the encoder wheel reduces the sensitivity of the MR sensor and affects the amplitude of a detection output signal derived from a MR element. Typically, a MR element exhibits only a two to three percent change of resistance when brought into the influence of a magnetic field. Accordingly, increasing or varying the spacing between the magnetic information and the sensor would substantially reduce or affect the detected signal amplitude. In general, the arrangement illustrated in FIG. 1 provides a substantial advantage over other arrangements since the encoder wheel can be produced with a circumferential face surface having high degree of accuracy thereby minimizing or substantially eliminating variations in the spacing between the circumferential face surface of the encoder wheel and the sensor as the encoder wheel rotates. Consequently, substantially the same amplitude output detection signal is produced at all positions of the encoder wheel 12 relative to the sensor 10 during the rotation of the wheel about the axis 14.

Figure 2:
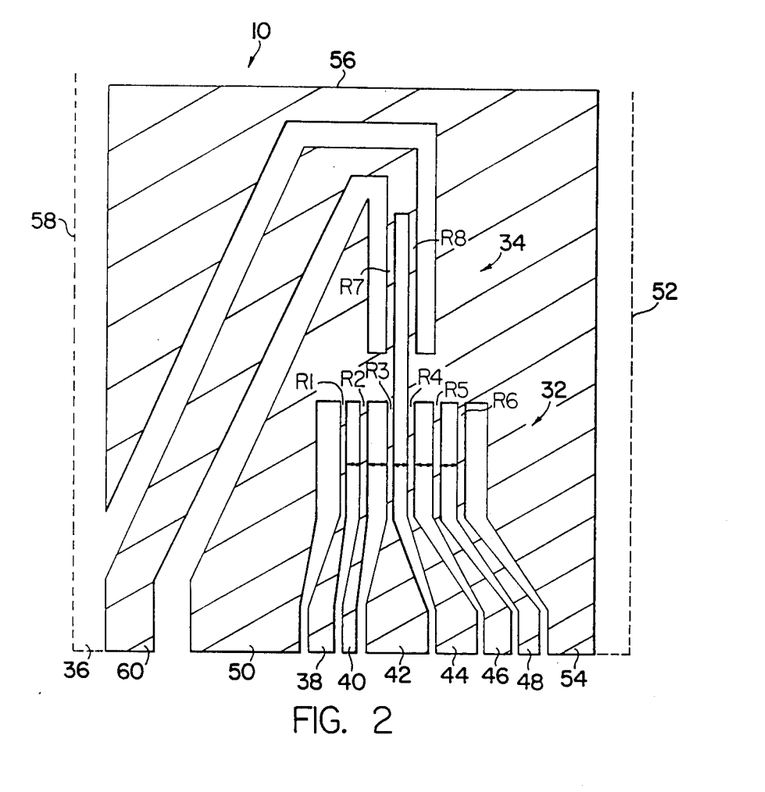
FIG. 2 schematically shows the construction of a MR sensor according to a preferred embodiment of the present invention.

Turning now to FIG. 2, the sensor 10 embodying the present invention is shown schematically therein and illustrates a MR element arrangement to sense magnetic information recorded on an incremental information track of an encoder wheel used in conjunction with the sensor. The MR element arrangement permits the sensor to be used with a number of different diameter encoder wheels wherein each different diameter wheel may contain a different number of pieces of magnetic information each recorded at different spacing or wavelengths. The sensor 10 further includes a MR element arrangement to sense magnetic information recorded on an index information track of an associated encoder wheel used in conjunction with the sensor.

The sensor 10 includes a first magnetoresistive element pattern generally indicated 32 for detection of magnetic information recorded on an associated incremental information track of an associated encoder wheel and which detected information is used to determine the relative rotational movement of the wheel. A second MR element pattern designated generally 34 for detection of magnetic information recorded on an associated index information track of an associated encoder wheel and which detected information is used to determine the absolute rotational movement of the wheel. The MR element patterns 32, 34 are formed on a non-magnetic substrate 36 of a single chip through well known vacuum sputtering and etching techniques.

The MR elements in the pattern 32 are designated R1, R2, R3, R4, R5, and R6 respectively, and are arranged to form the resistive elements of a plurality of differential bridge circuits and which resistive elements are interconnected in a predetermined manner in accordance with the wavelength and diameter of an associated encoder wheel with which the sensor is used. The MR elements R1-R6 have an elongated stripe-shaped profile and are in a predetermined spaced, side-by-side relation with one another as explained in detail below. Each of the MR elements R1-R6 extend in the longitudinal direction and have one end connected to a respective output terminal 38, 40, 42, 44, 46 and 48, respectively. The output terminals are made of the same magnetoresistive material as the MR elements and which terminals are land areas to form the electrical connection points between the sensor and an associated electrical conduit as illustrated in FIG. 1. The respective ends of MR elements R1, R2, and R3, opposite the output terminal ends are connected in common and extend for a short distance transverse to the longitudinal direction of the MR elements R1-R3 and around the outermost side of MR element R1 to a position adjacent the output terminal 38 associated with MR element R1 and forms a first power supply connection terminal 50 and which connection terminal is a land area to which the electrical conduit is attached and to which a voltage potential is applied from an external power supply source. The respective ends of MR elements R4, R5 and R6 opposite to their output terminal ends are also connected in common and extend for a short distance transverse to the elements R4, R5, and R6 toward and fully along one side 52 of the substrate 36 and a portion of which extends around the outermost side of MR element R6 to a position adjacent the output terminal 48, associated with MR element R6 and forms a second power supply connection terminal 54 and which connection terminal is a land area to which the electrical conduit is attached and to which a voltage potential is applied from an external power supply source. The commonly connected ends of MR elements R4, R5 and R6 further extend transverse to the longitudinal direction of the MR elements R1–R8 and along the outermost side of the MR element R8, around the MR elements R7 and R8 along a side 56 opposite the side 55 of the substrate 36 containing the output connection terminals associated with MR elements R1–R6 and further extends for a portion in the longitudinal direction along one side 58 of the substrate 36 opposite the side 52. The widths of the terminals 38 to 48, 50 and 54 are substantially wider than the width of the MR elements R1–R8 to minimize the influence of other recorded magnetic information on the encoder wheel thereby substantially reducing the possibility of inducing erroneous or degraded sensed signals.

The second MR element pattern 34 includes MR elements R7 and R8 arranged in a side-by-side relationship and disposed opposite to and extending longitudinally in the opposite direction of the MR elements R1–R6. One end of MR element R7 is connected to the commonly connected terminals of elements R1 to R3. One end of MR element R7 is connected to the commonly connected terminals of MR elements R4–R6. Accordingly, one end of MR element R7 is connected to terminal 50 and one end of MR element R8 is connected to terminal 54. The respective opposite ends of MR elements R7 and R8 are connected in common and extend for a short distance in the longitudinal direction toward the side 56 of the substrate 36, then continuing in a transverse direction and along the outermost side of terminal 50 to a position adjacent terminals 38 to 48, 50 and 54 and at one side of terminal 50 furthest from side 52 of the substrate 36 to form an index output connection terminal 60 and which terminal 60 is a land area to which the electrical conduit is attached. Terminal 60 extends intermediate the output terminal 50 and the portion of terminal 54 at the one side 58 of the substrate 36. The width of terminal 60 is substantially wider than the width of the MR elements R1–R8 to minimize any possible influence of other recorded magnetic information on the encoder wheel which may cause erroneous or degraded sensed signals.

As can be seen from FIG. 2, the construction of the magnetoresistive sensor is such that the MR material forming the power supply connection terminals 50 and 54 substantially surround the MR elements R1–R8 and cover a substantial portion of the substrate surface to form a heat sink for the sensor. In operation, heat generated by the MR elements due to power dissipation is conducted away from the MR elements and the substrate via the power supply connections. Localized "hot spots" which can cause an MR element to shift with respect to another MR element are minimized or eliminated thereby providing temperature stability for the sensor and maintaining the spacing between the MR elements to a high degree of accuracy. In addition, to serving as a heat sink, the arrangement of the MR material forming the power supply connections serves as a planar ground to shield the MR elements from electromagnetic interference and noise.

Figure 3:
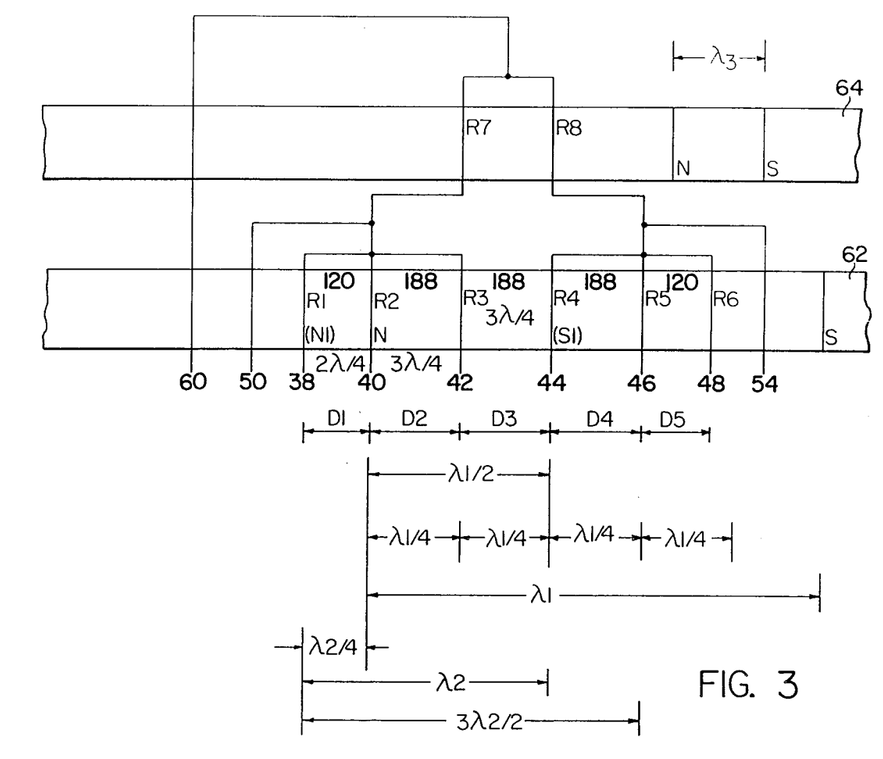
FIG. 3 schematically shows the MR elements associated with the incremental group of MR elements and the index group of MR elements together with a schematic representation of a magnetic recording medium used in connection therewith.
Figure 4:
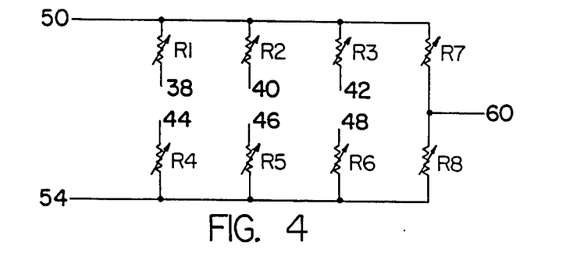
FIG. 4 is a circuit diagram showing the MR elements of the sensor of the present invention which may be selectively connected in an interleaved fashion to form an associated bridge circuit corresponding to the wavelength ($\lambda$) of magnetic information recorded on a magnetic recording medium and to be sensed by the sensor.

Considering now FIGS. 3 and 4, the sensor of the present invention is shown schematically wherein the magnetoresistive elements R1–R8 comprising the incremental and index groups of MR elements respectively are shown in relation to an associated recording medium upon which magnetic information is recorded on an incremental track 62 and an index track 64. FIG. 4 illustrates schematically the magnetoresistive elements R1–R6 of the sensor which may be selectively connected in a predetermined interleaved fashion to form a number of associated bridge circuits each corresponding to a given wavelength ($\lambda$) of the magnetic information recorded on the magnetic recording medium. The schematic representation of the MR elements R1–R8 and the respective external power supply connection terminals 50 and 54 and the index terminal 60 correspond to the construction of the sensor as described above in conjunction with FIG. 2.

As illustrated in FIG. 3, the spacing between the MR elements is predetermined and is related to the spacing of the magnetic information on the magnetic recording medium. In FIG. 3 the spacing between MR elements R1 and R2 is equal to a distance D1; the spacing between MR elements R2 and R3 is equal to a distance D2; the spacing between MR elements R4 and R5 is equal to a distance D4, and the spacing between MR elements R5 and R6 is equal to a distance D5. The spacing between the two groups comprising MR elements R1–R3 and MR elements R4–R6 is equal to the spacing D3 which is also the spacing between MR elements R3 and R4. In the preferred embodiment, the spacing D1 is equal to the spacing D5. The spacing between MR elements as represented by D2, D3 and D4 are also equal to one another.

As can be seen from the MR element arrangement shown in FIG. 4, a corresponding differential bridge configuration may be made for each of a number of different wavelength magnetic information. For example, in FIG. 3 the magnetic recorded information represented by the wavelength ($\lambda 1$) would be detected by a bridge configuration in which MR elements R2 and R4 are connected in an interleaved fashion via terminals 40 and 44 to form one bridge output terminal and the MR elements R3 and R5 are connected in an interleaved fashion via terminals 42 and 46 to form a second bridge output terminal. Accordingly, the spacing between the MR elements of each of the two different groups is spaced at a distance equal to ($\lambda \frac{1}{2}$) in accordance with well known sensing techniques. Furthermore, the spacing between the respective MR elements in each group associated with the sensing of the magnetic information having a wavelength ($\lambda 1$) are separated from one another by a distance equal to ($\lambda \frac{1}{4}$) with the spacing between groups being ($\lambda \frac{1}{4}$).

As discussed above, the sensor of the present invention may be configured to sense magnetic information recorded at different wavelengths. For example, as illustrated in FIG. 3, a wavelength equal to ($\lambda 2$) would be sensed by the MR element R1 connected in an interleaved fashion with MR element R5 via terminals 38 and 46 respectively to form one bridge output terminal wherein the spacing between the MR elements R1 and R5 is an odd multiple of ($\lambda 2/2$). Additionally, MR element R2 is connected in an interleaved fashion with MR element R6 via terminals 40 and 48 to form a second bridge output terminal wherein the spacing between MR elements R2 and R6 is an odd multiple of ($\lambda 2/2$).

As also illustrated in FIG. 3, the wavelength of magnetic information representative of index information recorded on the index track 64 is shown as ($\lambda 3$) and which information is sensed by the MR elements R7 and R8 to provide an output index signal at terminal 60. Accordingly, the MR sensor of the present invention may be used to detect and sense index magnetic information without detecting and sensing incremental magnetic information.

The construction of the MR sensor of the present invention is such that it may be used to sense a magnetic recording medium having magnetic information recorded at a number of different wavelengths and wherein the MR element pattern array is such that the required differential bridge configurations for sensing each of the different wavelengths are obtainable without complex path crossings of the magnetoresistive areas on the substrate or double sided substrate construction techniques. Thus it is seen that the sensor of the present invention is relatively inexpensive to construct compared to more complex fabrication methods generally required to achieve different configurations from a single pattern layout on a substrate while at the same time the sensor remains capable of sensing magnetic information recorded on a magnetic recording medium at a number of different wavelengths. It is further seen that the sensor of the present invention also includes a MR element pattern array to detect magnetic recorded indexing information which may be used to determine the absolute position of a magnetic recording medium upon which the magnetic information is recorded. It is also seen that the arrangement of the magnetoresistive material on the sensor substrate provides a heat sink to substantially eliminate thermal gradients from developing across the substrate and consequently preventing shifting of the MR elements relative to one another to insure sensing accuracy. In addition to thermal stability, the arrangement of the magnetoresistive material on the sensor substrate provides an electromagnetic ground plane to shield the MR elements from electromagnetic interference and noise, consequently improving the overall performance of the sensor.

In one preferred embodiment of the present invention, the spacing D1 and D5 which represents the center-to-center spacing between the MR elements R1 and R2 and R5 and R6, respectively is 120 microns. The center-to-center spacing between MR elements R2 and R3, R3 and R4, and R5 and R6 corresponding respectively to distances D2, D3 and D4 is 188 microns. The substrate material is non-magnetic and may be soda lime glass or other suitable ceramic material. The magnetoresistive material is a suitable permalloy material and the width of each of the MR elements R1-R8 is 25 microns.

A magnetic sensor having MR elements arranged to sense a number of different diameter encoder wheels containing magnetic information recorded thereon at different wavelengths is described above. It will be recognized that numerous changes and modifications from the preferred embodiment may be made by those skilled in the art without departing from the spirit and scope of the invention. Accordingly, the present invention has been described by way of illustration rather than limitation.

I claim:

1. A magnetoresistive displacement sensor for use with a number of different diameter magnetic recording media wheels carrying plural pieces of magnetic information recorded on at least on circumferentially running track, each of said different wheels having its associated magnetic information spaced with a predetermined constant wavelength ($\lambda$), said sensor being disposed adjacently opposite to said magnetic recording media, said sensor arrangement comprising:

at least two groups of magnetoresistive (MR) elements wherein each group includes a first plurality of elongated stripe-shaped MR elements in side-by-side relation with one another on the surface of a non-magnetic substrate, each of said MR elements extending in a longitudinal direction transverse to the direction of relative movement between the sensor and the magnetic recording media, the widths of said MR elements in the rotation direction being made substantially smaller than the wavelength ($\lambda$) and each of said MR elements having a first and a second end;

each of said groups comprising at least three MR elements, said first ends of said MR elements associated with each respective group being connected together, a first MR element in said first group being spaced a first predetermined distance from a second MR element in said first group in the direction of movement, said second MR element in said first group being spaced a second predetermined distance from a third MR element in said first group in the direction of movement, a first MR element in said second group being spaced a third predetermined distance from a second MR element in said second group in the direction of movement, said second MR element in said second group being spaced a fourth predetermined distance from a third MR element in the direction of movement, said third MR element of said first group being spaced a fifth predetermined distance from said first MR element of said second group, said second, third and fifth distances being substantially equal to one another and said first and fourth distances being substantially equal to one another and different from said second, third and fifth distances;

means forming an output connection terminal at each respective second end of said MR elements, said output terminals extending in a longitudinal direction in a side-by-side manner along one side of said non-magnetic substrate;

said connected first ends of said MR elements associated with said first group forming means for a first external power supply connection terminal and said connected first ends of said MR elements associated with said second group forming means for a second external power supply connection terminal;

said first and second external power supply connection terminals extending to a position adjacent said output connection terminals provided at said second ends of said MR elements;

said second end of one of said three MR elements in said first group being arranged for selective external connection to said second end of one of said three MR elements in said second group so that the distance between said selectively connected MR element in said first groups and said selectively connected MR element in said second group is substantially equal to an odd multiple of $\lambda/2$, said second end of another one of said three MR elements in said first group being arranged for selective external connection to said second end of another one of said three MR elements in said second group so that the distance between said selectively connected another MR element in said first group and said selectively connected another MR element in said second group is substantially equal to an odd multiple of $\lambda/2$;

said selectively connected one MR element in said first group being spaced a distance equal to an odd multiple of $\lambda/4$ from being selectively connected another MR element in said first group and from said selectively connected another MR element in said second group, and said selectively externally connected second end of said one MR element in said first group and said selectively connected MR element in said second group respectively forming a first output connection, and said selective externally connected second end of said another MR element in said first group and selectively connected second end of said another MR element in said second group, respectively, forming a second output connection.

2. A magnetoresistive displacement sensor as defined in claim 1, further including a third group of MR elements not associated with said at least two groups of MR elements for sensing indexing magnetic information recorded on at least one circumferentially running track separate from the circumferentially tracks carrying the incremental magnetic information, said third group of MR elements including a second plurality of elongated stripe-shaped MR elements in a side-by-side relation with one another on said non-magnetic substrate and disposed longitudinally opposite said first plurality of MR elements, the widths of said MR elements in said second plurality of MR elements in the rotation direction being made substantially smaller than the wavelength ($\lambda$) and each having a first and a second end, said first ends of said MR elements in said second plurality being connected together, said second end of one of said MR elements in said second plurality of MR elements being connected to said commonly connected first ends of one of said first and second groups of MR elements and the second end of another of said MR elements in said second plurality of MR elements being connected to said commonly connected first ends of the other of said first and second groups, said connected first ends of said MR elements in said second plurality including means for forming an index connection terminal and extending to said one side of said non-magnetic substrate to a position adjacent said output connection terminals provided at said second ends of said MR elements, and said MR elements of said third group being spaced a distance substantially equal to said spacing between said first and second groups of MR elements, said spacing being equal to said fifth predetermined distance.

3. A magnetoresistive displacement sensor as defined in claim 2 further characterized by:

said first external power supply connection terminal having a width substantially larger than the width of each of the MR elements in said first, second and third groups of MR elements and extending in the longitudinal direction substantially along an outerside face of an outermost one of said MR elements in one of said first and second groups and an outerside face of one of said MR elements in said third group and in the transverse direction substantially across the substrate in the direction of rotation and partially along the substrate in the longitudinal direction at the outermost portion of the substrate furthest from said outermost one of said MR elements in said one of said first and second groups, and said second external power supply connection terminal having a width substantially larger than the width of each of the MR elements and extending generally in the longitudinal direction and substantially along an outerside face of an outermost one of said MR elements in the other of said first and second groups and an outerside face of the other of said MR elements in said third group, said first and second external power supply connection terminals substantially surrounding said MR elements of said first, second and third groups and covering a substantial portion of said substrate surface to provide a heat sink whereby thermal gradients are substantially eliminated from developing across said substrate surface and said MR elements are electrically shielded from noise and electromagnetic interference.

4. A magnetoresistive displacement sensor as defined in claim 3 further characterized by said index connection terminal having a width substantially larger than the width of each of the MR elements and extending generally in the longitudinal direction and intermediate said first and second external power supply connection terminals.

5. A magnetoresistive displacement sensor as defined in claim 1 further characterized by said output connection terminal at each respective second end of said MR elements being made of the same magnetoresistive material as the MR elements and each of said output connection terminals having a width substantially wider than the width of said MR elements.

6. A magnetoresistive displacement sensor for use with a magnetic recording encoder wheel carrying plural pieces of magnetic information recorded on at least one circumferentially running track, said wheel having its associated magnetic information spaced with a predetermined constant wavelength ($\lambda$), said sensor being disposed adjacently opposite to said encoder wheel, said sensor arrangement comprising:

at least one group of magnetoresistive (MR) elements wherein each group includes at least two elongated stripe-shaped MR elements in a side-by-side relation with one another on the surface of a non-magnetic substrate, each of said MR elements extending in a longitudinal direction transverse to the direction of relative movement between said sensor and said encoder wheel, the widths of said MR elements in the rotation direction being made substantially smaller than the wavelength ($\lambda$) and each of said MR elements having a first and second end;

means forming an output connection terminal at each respective second end of said MR elements, said output terminals extending in a longitudinal direction in a side-by-side manner along one side of said non-magnetic substrate;

first means for connecting said first end of one of said MR elements in one of said at least one group to means forming a first external power supply connection terminal;

second means for connecting said first end of another of said MR elements in said one of said at least one group to means forming a second external power supply connection terminal;

said one and another of said MR elements in said one group being spaced apart a predetermined distance from one another in the direction of relative movement, said spacing being substantially equal to the wavelength ($\lambda$) corresponding to magnetic information recorded on an index track of an encoder wheel with which said sensor cooperates;

said second ends of said one and another of said MR elements in said one group further being connected in common for forming an index connection terminal;

said first external power supply connection terminal having a width substantially larger than the width of each of the MR elements in said at least one group, and extending in the longitudinal direction substantially along an outside face of an outermost one of said MR elements in said at least one group and in a transverse direction substantially across the substrate in the direction of relative movement and partially along the substrate in the longitudinal direction at the outermost position of the substrate furthest from said outermost one of said MR elements in said at least one group, and said second external power supply connection terminal having a width substantially larger than the width of each of the MR elements in said at least one group and extending generally in the longitudinal direction and substantially along an outside face of the outermost of another of said MR elements in said at least one group, said first and second external power supply connection terminals substantially surrounding said MR elements and covering a substantial portion of said substrate to provide a heat sink whereby thermal gradients are substantially eliminated from developing across said substrate surface and for electrically shielding said MR elements from noise and electromagnetic interference.

* * * * *